United States Patent
Xie et al.

(10) Patent No.: US 11,935,929 B2
(45) Date of Patent: Mar. 19, 2024

(54) HIGH ASPECT RATIO SHARED CONTACTS

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Su Chen Fan, Cohoes, NY (US); Ravikumar Ramachandran, Pleasantville, NY (US); Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 176 days.

(21) Appl. No.: 17/507,385

(22) Filed: Oct. 21, 2021

(65) Prior Publication Data
US 2023/0130305 A1    Apr. 27, 2023

(51) Int. Cl.
*H01L 29/417*        (2006.01)
*H01L 21/8238*       (2006.01)
(Continued)

(52) U.S. Cl.
CPC .......... *H01L 29/41725* (2013.01); *H01L 21/823871* (2013.01); *H01L 23/5286* (2013.01);
(Continued)

(58) Field of Classification Search
CPC ....... H01L 29/41725; H01L 21/823871; H01L 23/5286; H01L 27/0922; H01L 29/401;
(Continued)

(56) References Cited

U.S. PATENT DOCUMENTS 6,690,053 B2   2/2004  Arno et al.
7,741,644 B2   6/2010  Lyu et al.
(Continued)

FOREIGN PATENT DOCUMENTS

WO    2019172879 A1    9/2019

OTHER PUBLICATIONS

Sullivan et al., "Overlay metrology: the systematic, the random and the ugly", AIP Conference Proceedings Nov. 24, 1998 (vol. 449, No. 1, pp. 502-512). American Institute of Physics.
(Continued)

*Primary Examiner* — Duy T Nguyen
(74) *Attorney, Agent, or Firm* — Tutunjian & Bitetto, P.C.; L. Jeffrey Kelly

(57) ABSTRACT

A stacked device is provided. The stacked device includes a reduced height active device layer, and a plurality of lower source/drain regions in the reduced height active device layer. The stacked device further includes a lower interlayer dielectric (ILD) layer on the plurality of lower source/drain regions, and a conductive trench spacer in the lower interlayer dielectric (ILD) layer, wherein the conductive trench spacer is adjacent to one of the plurality of lower source/drain regions. The stacked device further includes a top active device layer adjacent to the lower interlayer dielectric (ILD) layer, and an upper source/drain section in the top active device layer. The stacked device further includes a shared contact in electrical connection with the upper source/drain section, the conductive trench spacer, and the one of the plurality of lower source/drain regions.

14 Claims, 17 Drawing Sheets

(51) Int. Cl.
*H01L 23/528* (2006.01)
*H01L 27/092* (2006.01)
*H01L 29/40* (2006.01)
*H01L 29/45* (2006.01)

(52) U.S. Cl.
CPC ........ *H01L 27/0922* (2013.01); *H01L 29/401* (2013.01); *H01L 29/45* (2013.01)

(58) Field of Classification Search
CPC . H01L 29/45; H01L 21/76844; H01L 23/481; H01L 23/485; H01L 21/76897; H01L 21/76898; H01L 21/8221; H01L 21/823475; H01L 27/0688
USPC ......................................................... 257/369
See application file for complete search history.

(56) References Cited

U.S. PATENT DOCUMENTS

| | | | |
|---|---|---|---|
| 8,476,145 B2 | 7/2013 | Or-Bach et al. | |
| 9,659,963 B2 | 5/2017 | Cheng et al. | |
| 9,711,501 B1 | 7/2017 | Basker et al. | |
| 10,192,867 B1 | 1/2019 | Frougier et al. | |
| 2006/0264025 A1* | 11/2006 | Kim | H01L 27/0688 257/E21.597 |
| 2009/0078970 A1* | 3/2009 | Yamazaki | H01L 21/8221 257/E27.112 |
| 2011/0156107 A1* | 6/2011 | Bohr | H01L 29/0847 257/E21.409 |
| 2012/0135577 A1* | 5/2012 | Lee | H01L 29/78 257/E21.409 |
| 2016/0181353 A1* | 6/2016 | Ando | H10B 12/0387 438/386 |
| 2017/0117272 A1* | 4/2017 | Sio | H01L 23/528 |
| 2019/0355756 A1 | 11/2019 | Nelson et al. | |
| 2020/0126987 A1 | 4/2020 | Rubin et al. | |

OTHER PUBLICATIONS

International Search Report issued in corresponding PCT Application Serial No. PCT/EP2022/077225 dated Feb. 8, 2023.

* cited by examiner

HIGH ASPECT RATIO SHARED CONTACTS

BACKGROUND

The present invention generally relates to high aspect ratio contacts, and more particularly to methods and structures for high aspect ratio shared contacts for stacked field effect transistor devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate. Depending on the doping of the source and drain, an n-FET or a p-FET can be formed.

SUMMARY

In accordance with an embodiment of the present invention, a stacked device is provided. The stacked device includes a reduced height active device layer, and a plurality of lower source/drain regions in the reduced height active device layer. The stacked device further includes a lower interlayer dielectric (ILD) layer on the plurality of lower source/drain regions, and a conductive trench spacer in the lower interlayer dielectric (ILD) layer, wherein the conductive trench spacer is adjacent to one of the plurality of lower source/drain regions. The stacked device further includes a top active device layer adjacent to the lower interlayer dielectric (ILD) layer, and an upper source/drain section in the top active device layer. The stacked device further includes a shared contact in electrical connection with the upper source/drain section, the conductive trench spacer, and the one of the plurality of lower source/drain regions.

In accordance with another embodiment of the present invention, a stacked device is provided. The stacked device includes a reduced height active device layer, and a plurality of lower source/drain regions in the reduced height active device layer. The stacked device further includes a gate structure adjoining an adjacent pair of the plurality of lower source/drain regions, and a lower interlayer dielectric (ILD) layer on the plurality of lower source/drain regions. The stacked device further includes a conductive trench spacer in the lower interlayer dielectric (ILD) layer, wherein the conductive trench spacer is adjacent to one of the adjacent pair of the plurality of lower source/drain regions. The stacked device further includes a bonded dielectric layer adjacent to the lower interlayer dielectric (ILD) layer, and a top active device layer adjacent to the bonded dielectric layer, wherein the bonded dielectric layer is between the lower interlayer dielectric (ILD) layer and the top active device layer. The stacked device further includes an upper source/drain section in the top active device layer, and a shared contact in electrical connection with the upper source/drain section, the conductive trench spacer, and the one of the plurality of lower source/drain regions.

In accordance with yet another embodiment of the present invention, a method of forming a stacked device is provided. The method includes forming a plurality of lower source/drain regions in a lower active device layer, and forming a lower interlayer dielectric (ILD) layer on the plurality of lower source/drain regions. The method further includes forming a contact trench in the lower interlayer dielectric (ILD) layer above one of the plurality of lower source/drain regions, and forming a sacrificial contact at the bottom of the contact trench on the one of the plurality of lower source/drain regions. The method further includes forming a conductive trench spacer in the contact trench on the lower interlayer dielectric (ILD) layer, wherein the conductive trench spacer is adjacent to the sacrificial contact, and forming a sacrificial plug on the conductive trench spacer and the sacrificial contact in the contact trench. The method further includes forming a first dielectric bonding layer on the lower interlayer dielectric (ILD) layer, and attaching a second active device layer to the first dielectric bonding layer through a second dielectric bonding layer to form a top active device layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a shared contact between a top device and a bottom device. A stacked device can include a top field effect transistor (FET) device over a bottom field effect transistor device, where each have source/drains on opposite sides of a device channel region. The shared contact can form an electrical connection between a source/drain of the top device and a source/drain of the bottom device.

In various embodiments, the shared contact can have a reversed T-shape in contact with the bottom source/drain. The shared contact can have a metal sidewall liner for the bottom contact, where the metal sidewall liner can sit over the T-shape contact head.

Embodiments of the present invention provide a method of forming the shared contact through a top source/drain to the bottom source/drain using a sacrificial core.

Exemplary applications/uses to which the present invention can be applied include, but are not limited to: stacked field effect transistor (FET) devices, including n-type FETs and/or p-type FETs, complimentary field effect transistor (CFET) devices, and logic devices utilizing stacked FETs and/or CFETs.

It is to be understood that aspects of the present invention will be described in terms of a given illustrative architecture; however, other architectures, structures, substrate materials and process features and steps can be varied within the scope of aspects of the present invention.

Figure 1:
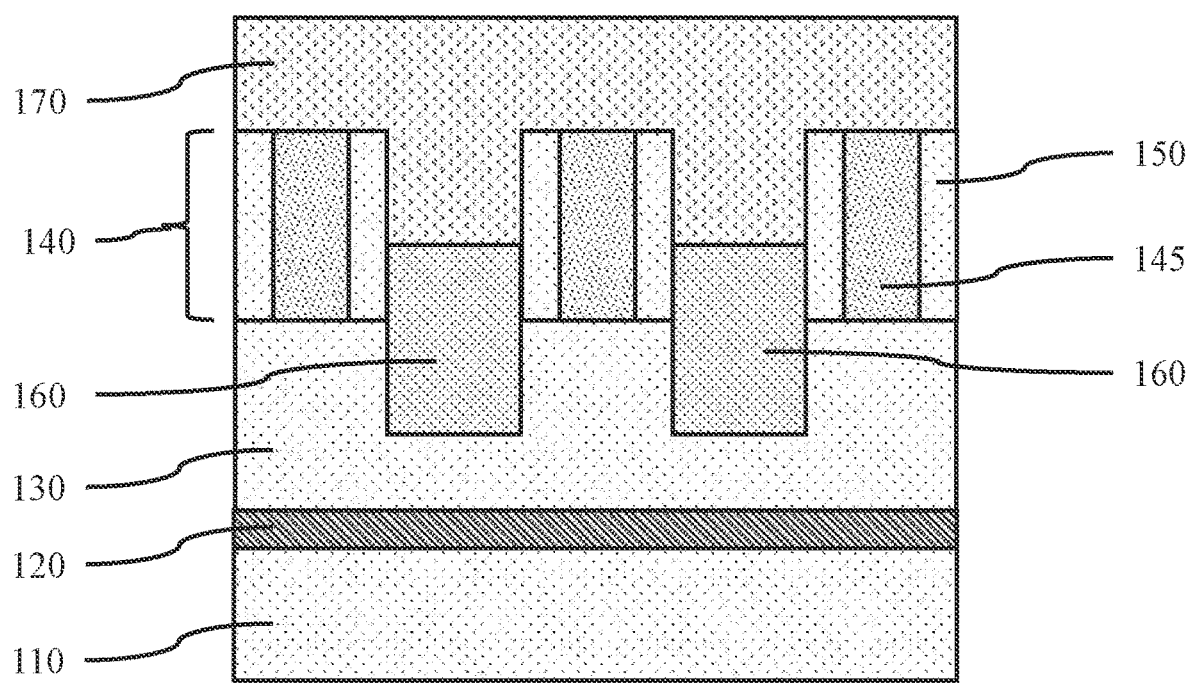
FIG. 1 is a cross-sectional side view showing a plurality of gate structures and source/drain regions on an active device layer on an etch stop layer and an initial substrate, in accordance with an embodiment of the present invention.

Referring now to the drawings in which like numerals represent the same or similar elements and initially to FIG. 1, FIG. 1 is a cross-sectional side view showing a plurality of gate structures and source/drain regions on an active device layer on an etch stop layer and an initial substrate, in accordance with an embodiment of the present invention.

In one or more embodiments, a plurality of gate structures 140 and source/drain regions 160 can be formed on an active device layer 130, where the gate structures 140 and source/drain regions 160 can form one or more field effect transistor (FET) devices on a substrate. Each gate structure 140 can include a gate region 145 with a sidewall spacer 150 on opposite sides of the gate region 145. The gate region 145 can include a gate dielectric layer over a device channel and a conductive gate electrode on the gate dielectric layer. A source/drain region 160 can be formed in the active device layer 130, where a source/drain region 160 can be on opposite sides of a gate structure 140. Each combination of a gate structure and the source/drains can form a functioning device on the substrate.

In various embodiments, the active device layer 130 can be on an etch-stop layer 120, where the etch stop layer 120 can be on a support layer 110. The active device layer 130 can be a semiconductor material that can form active devices, including channel regions and source/drains.

In various embodiments, the active device layer 130 can be a group IV semiconductor material, for example, silicon (Si) or germanium (Ge), a IV-IV compound semiconductor material, for example, silicon-germanium (SiGe) or silicon carbide (SiC), a III-V compound semiconductor material, for example, gallium nitride (GaN) or gallium arsenide (GaAs), and combinations thereof.

In various embodiments, the active device layer 130 can be a part of a semiconductor-on-insulator (SeOI) substrate, where an etch-stop layer 120 can be an electrically insulating layer or a semiconductor material chemically different from the active device layer 130 and the support layer 110, between the active device layer 130 and a support layer 110, where the support layer can be a bulk substrate. The etch-stop layer 120 can be selectively etchable relative to the active device layer 130 and a support layer 110.

In various embodiments, the etch-stop layer 120 can be a dielectric material, including, but not limited to, an electrically insulating dielectric material, for example, silicon oxide (SiO), silicon nitride (SiN), silicon oxynitride (SiON), silicon boro carbonitride (SiBCN), a semiconductor material chemically different from the active device layer 130 and the support layer 110, for example, silicon-germanium having a suitably different germanium (Ge) concentration, and combinations thereof.

In various embodiments, the source/drain regions 160 may be formed in the active device layer 130 by epitaxial growth and doping, ion implantation into semiconductor material of the active device layer, or a combination thereof.

In various embodiments, an interlayer dielectric (ILD) layer 170 can be formed on the gate structure(s) 140 and the source/drain region(s) 160. In various embodiments, the interlayer dielectric (ILD) layer 170 can be an electrically insulating dielectric material, for example, silicon oxide (SiO), low-k dielectric materials, and combinations thereof.

Figure 2:
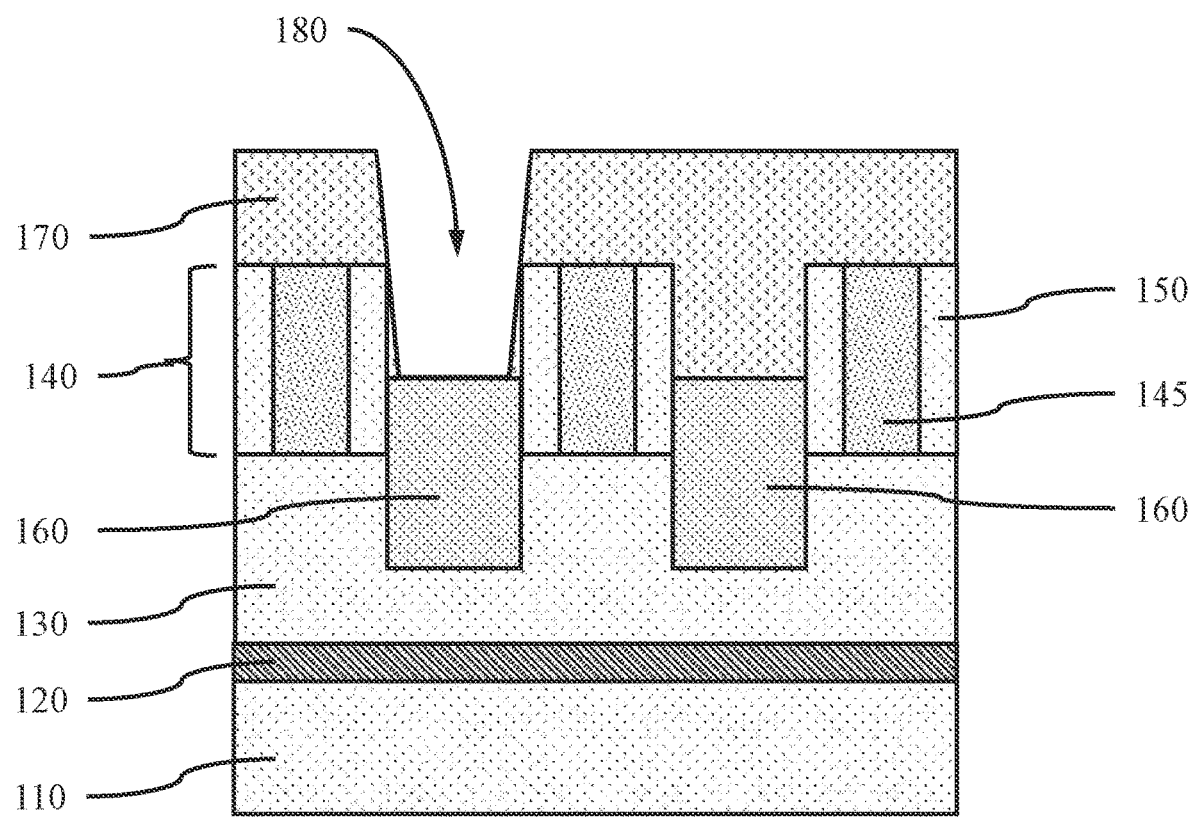
FIG. 2 is a cross-sectional side view showing a contact trench formed to a source/drain region, in accordance with an embodiment of the present invention.

FIG. 2 is a cross-sectional side view showing a contact trench formed to a source/drain region, in accordance with an embodiment of the present invention.

In one or more embodiments, a contact trench 180 can be formed in the ILD layer 170 to a source/drain region 160, where the contact trench 180 be formed by lithographic patterning and etching, for example, using a selective directional etch (e.g., a reactive ion etch (RIE)). The removal of the ILD layer 170 to form the contact trench 180 can expose a top surface of a source/drain region 160. In various embodiments, a portion of the ILD layer 170 can remain adjoining the sidewall spacer 150 of the gate structure.

Figure 3:
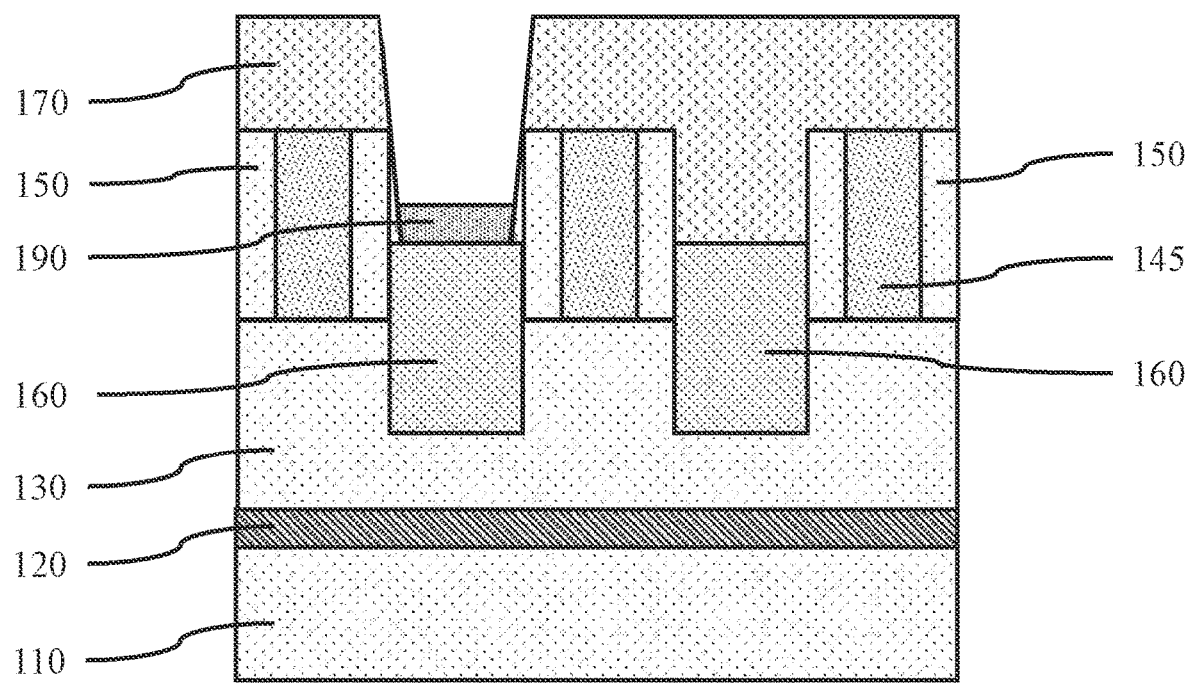
FIG. 3 is a cross-sectional side view showing a sacrificial contact formed in the contact trench on the exposed source/drain region, in accordance with an embodiment of the present invention.

FIG. 3 is a cross-sectional side view showing a sacrificial contact formed in the contact trench on the exposed source/drain region, in accordance with an embodiment of the present invention.

In one or more embodiments, a sacrificial contact 190 can be formed on the exposed portion of the source/drain region 160 at the bottom of the contact trench 180. In various embodiments, the sacrificial contact 190 can be formed by an epitaxial growth process.

In various embodiments, the sacrificial contact 190 can be a semiconductor material having different etch properties compared to the ILD layer 170 and the source/drain region 160, for example, the sacrificial contact 190 can be silicon-germanium (SiGe) on a silicon source/drain region 160, or silicon-germanium (SiGe) on a silicon-germanium (SiGe) source/drain region 160, where the germanium content of the sacrificial contact 190 is sufficiently different from the germanium content of the source/drain region 160 to allow selective etching.

Figure 4:
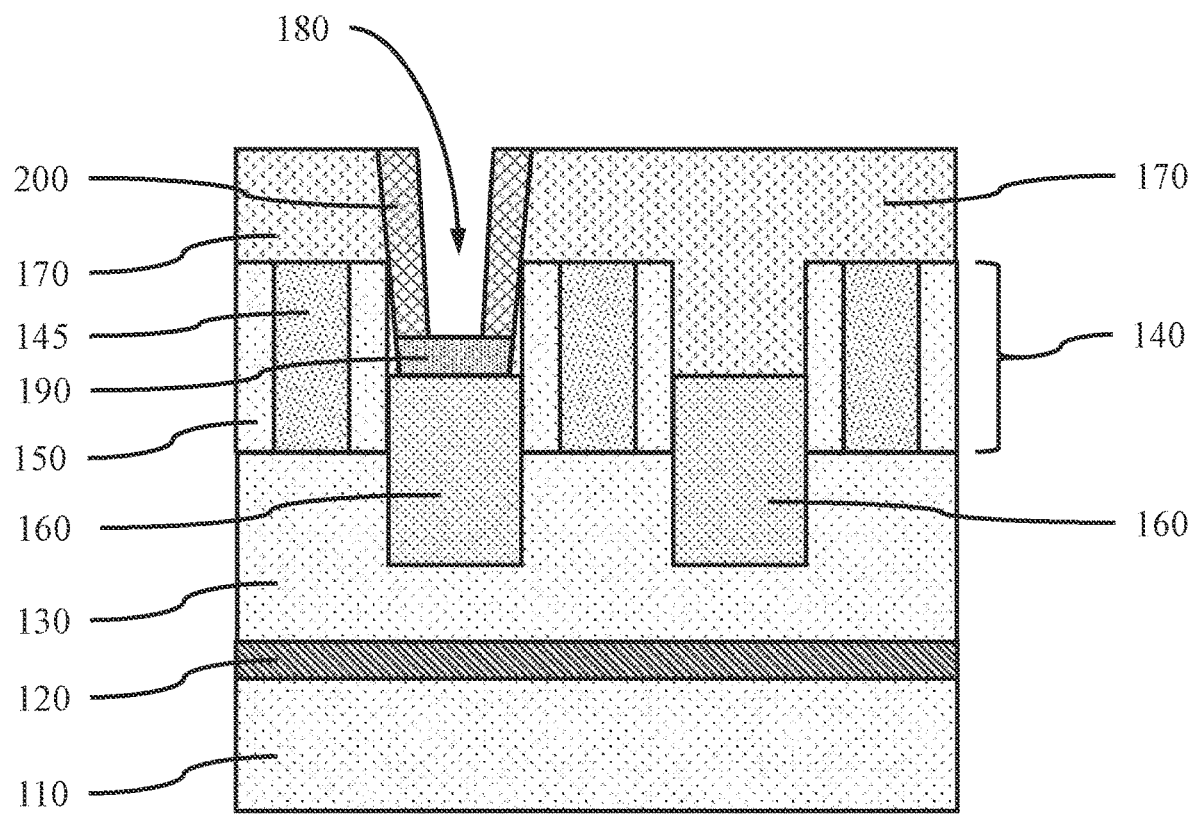
FIG. 4 is a cross-sectional side view showing a conductive trench spacer formed on the contact trench sidewalls and a portion of the sacrificial contact, in accordance with an embodiment of the present invention.

FIG. 4 is a cross-sectional side view showing a conductive trench spacer formed on the contact trench sidewalls and a portion of the sacrificial contact, in accordance with an embodiment of the present invention.

In one or more embodiments, a conductive trench spacer 200 can be formed on the sidewalls of the contact trench and the exposed portion of the sacrificial contact 190, where the conductive trench spacer 200 can be formed by a conformal deposition, for example, atomic layer deposition (ALD) or plasma enhanced ALD (PEALD). A selective directional etch can be used to remove the portion of the conductive trench spacer 200 formed at the bottom of the contact trench 180.

In various embodiments, the conductive trench spacer 200 can be a conductive metal compound material that provide diffusion barrier properties and/or adhesion properties, including, but not limited to, tantalum nitride (TaN), tantalum carbide (TaC), titanium nitride (TiN), titanium carbide (TiC), tungsten nitride (WN), and combinations thereof. In various embodiments, the conductive trench spacer 200 can be a multilayer structure including a low-resistance metal liner, for example, ruthenium (Ru), cobalt (Co), or tungsten (W), on the barrier/adhesion layer.

In various embodiments, the conductive trench spacer 200 can have a thickness in a range of about 2 nanometers (nm) to about 10 nm, or about 4 nm to about 6 nm, although other thicknesses are also contemplated.

Figure 5:
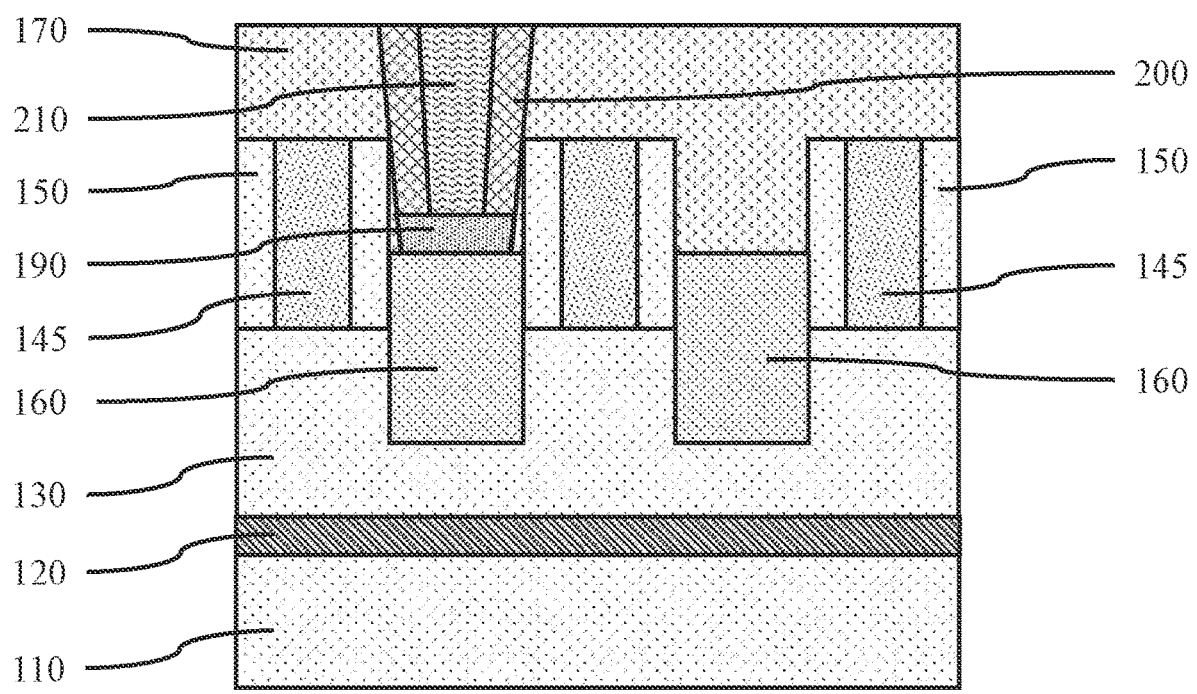
FIG. 5 is a cross-sectional side view showing a sacrificial plug formed on the conductive trench spacer and the sacrificial contact in the remaining space in the contact trench, in accordance with an embodiment of the present invention.

FIG. 5 is a cross-sectional side view showing a sacrificial plug formed on the conductive trench spacer and the sacrificial contact in the remaining space in the contact trench, in accordance with an embodiment of the present invention.

In one or more embodiments, a sacrificial plug 210 can be formed on the conductive trench spacer 200 and the sacrificial contact 190 in the remaining space in the contact trench 180, where the sacrificial plug 210 can be formed by a conformal deposition (e.g., ALD, PEALD), and a chemical-mechanical polishing (CMP) used to removed excess material above the surface of the interlayer dielectric (ILD) layer 170. The sacrificial plug 210 can fill in the space between opposing portions of the conductive trench spacer 200 on the sidewalls of the contact trench 180. A CMP can be used to remove excess material.

In various embodiments, the sacrificial plug 210 can be a sacrificial material that can selectively etched relative to the conductive trench spacer 200 and sacrificial contact 190, for example, amorphous silicon (a-Si), amorphous germanium (a-Ge), amorphous carbon (a-C), aluminum oxide (AlO), titanium oxide (TiO), and combinations thereof.

In various embodiments, the sacrificial plug 210 and the sacrificial contact 190 can be the same material, so the sacrificial plug 210 and the sacrificial contact 190 can be removed with a single etch.

Figure 6:
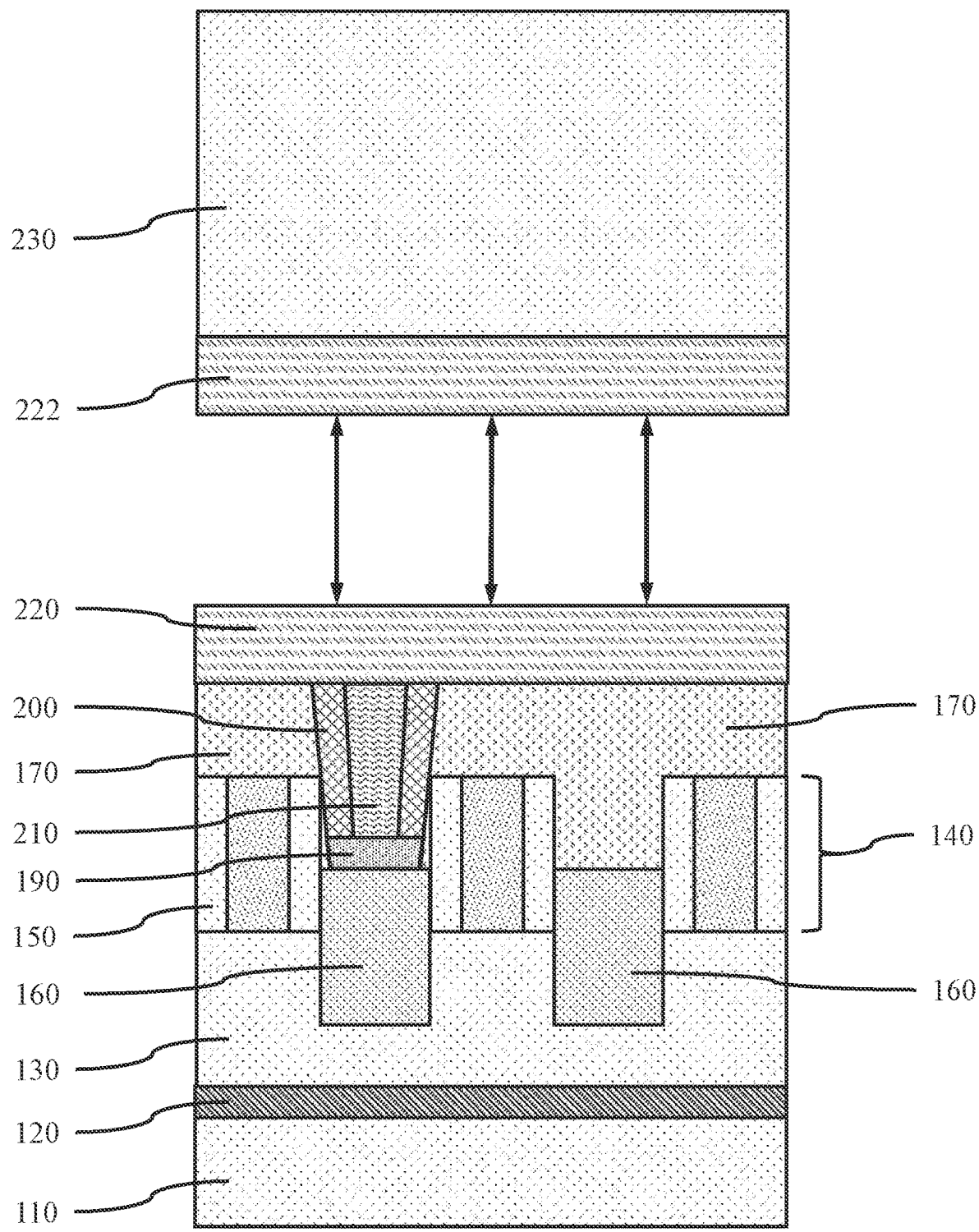
FIG. 6 is a cross-sectional side view showing a first dielectric bonding layer formed on a top surface of an ILD layer, the conductive trench spacer and the sacrificial plug, and a second dielectric bonding layer on a separate second active device layer, in accordance with an embodiment of the present invention.

FIG. 6 is a cross-sectional side view showing a first dielectric bonding layer formed on a top surface of an ILD layer, the conductive trench spacer and the sacrificial plug, and a second dielectric bonding layer on a separate second active device layer, in accordance with an embodiment of the present invention.

In one or more embodiments, a first dielectric bonding layer 220 can be formed on a top surface of the ILD layer 170, the conductive trench spacer 200, and the sacrificial plug 210, where the first dielectric bonding layer 220 can be formed by a blanket deposition, for example, chemical vapor deposition (CVD) or plasma enhanced CVD (PECVD).

In one or more embodiments, a second dielectric bonding layer 222 can be formed on a surface of second active device layer 230. Half of the bonding layer can be on the first wafer, and the other half of the bonding layer can be on the second wafer, which is going to be bonded.

In various embodiments, the first dielectric bonding layer 220 and the second dielectric bonding layer 222 can each be a dielectric material layer, for example, silicon oxide (SiO), silicon nitride (SiN), etc., that can allow the second active device layer 230 to be secured to the first dielectric bonding layer 220, previously formed layers, and devices, through a dielectric-to-dielectric bonding process.

Figure 7:
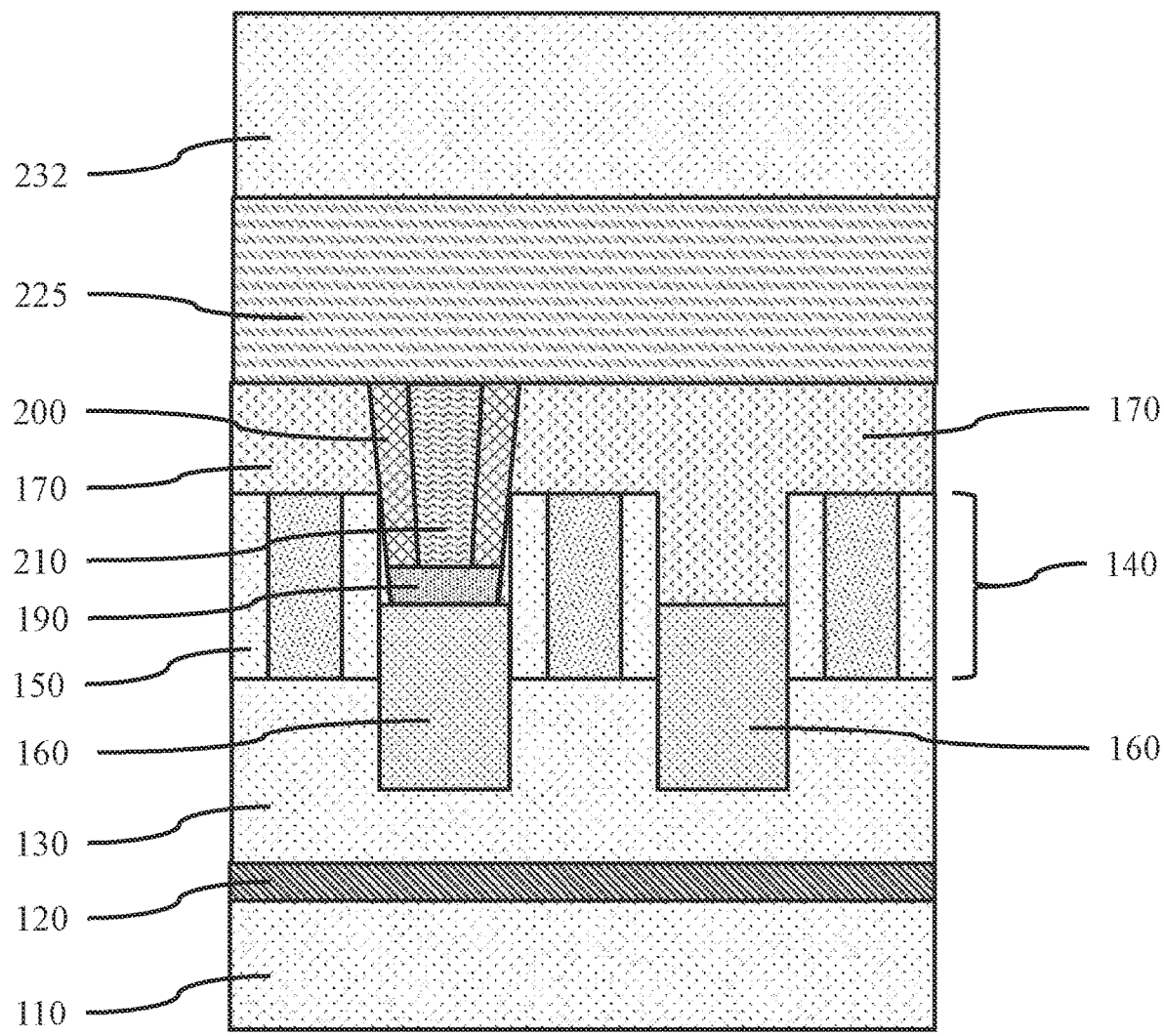
FIG. 7 is a cross-sectional side view showing the second dielectric bonding layer on a separate second active device layer attached to the first dielectric bonding layer formed on a top surface of an ILD layer, in accordance with an embodiment of the present invention.

FIG. 7 is a cross-sectional side view showing the second dielectric bonding layer on a separate second active device layer attached to the first dielectric bonding layer formed on a top surface of an ILD layer, in accordance with an embodiment of the present invention.

In one or more embodiments, a second active device layer 230 can be bonded to the first dielectric bonding layer 220 and bottom device(s) through the second dielectric bonding layer 222 using a dielectric bonding process, for example, oxide-oxide bonding, to form a top active device layer 232. Bonding the second dielectric bonding layer 222 to the first dielectric bonding layer 220 through the dielectric bonding process can form a bonded dielectric layer 225. In various embodiments, the top active device layer 232 can be thinned after bonding to the first dielectric bonding layer 220, where thinning can be accomplished by wafer grinding, chemical-mechanical polishing (CMP) and/or etching (e.g., wet chemical etching, dry plasma etching). In various embodiments, an etch stop layer, for example, implanted region, or SiGe layer, or some embedded dielectric layer, can be used to assist the wafer thinning process and define a thickness for a thinned active device layer.

Figure 8:
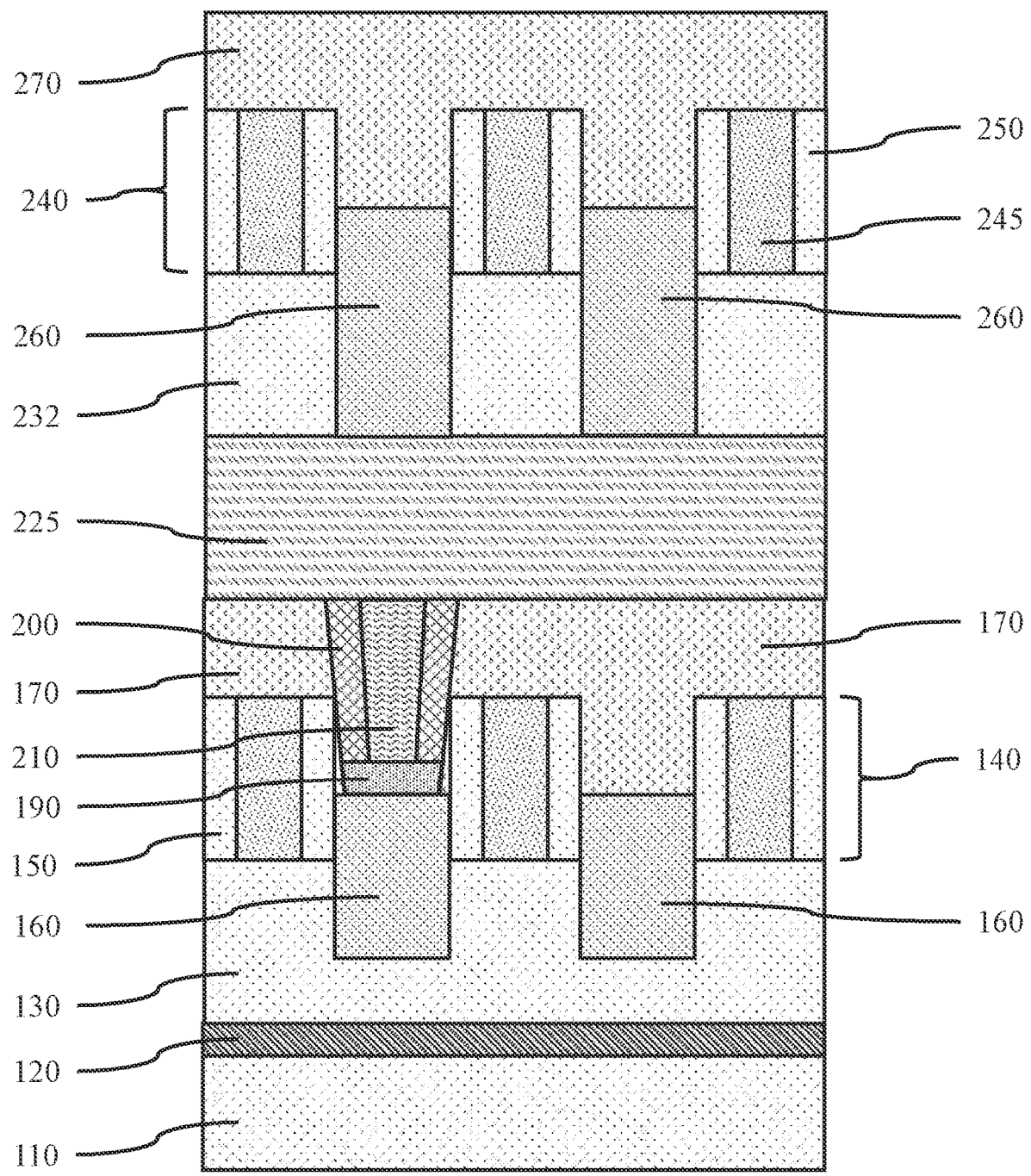
FIG. 8 is a cross-sectional side view showing a plurality of gate structures and source/drain regions on a top active device layer attached to the bonded dielectric layer, in accordance with an embodiment of the present invention.

FIG. 8 is a cross-sectional side view showing a plurality of gate structures and source/drain regions on a top active device layer attached to the bonded dielectric layer, in accordance with an embodiment of the present invention.

In various embodiments, a plurality of upper gate structures 240 and upper source/drain regions 260 can be formed on the top active device layer 232, where the upper gate structures 240 and upper source/drain regions 260 can form one or more field effect transistor (FET) devices on the bonded dielectric layer 225. Each upper gate structure 240 can include an upper gate region 245 with an upper sidewall spacer 250 on opposite sides of the upper gate region 245. The upper gate region 245 can include an upper gate dielectric layer over an upper device channel and an upper conductive gate electrode on the upper gate dielectric layer. An upper source/drain region 260 can be formed in the top active device layer 232, where an upper source/drain region can be on opposite sides of the upper gate structure 240. The upper source/drain region 260 can extend down to the surface of the bonded dielectric layer 225. Each combination of a gate structure and the source/drains can form a functioning device on the bonded dielectric layer 225.

In various embodiments, an upper interlayer dielectric (ILD) layer 270 can be formed on the upper gate structure(s) 240 and the upper source/drain region(s) 260. In various embodiments, the upper interlayer dielectric (ILD) layer 270 can be an electrically insulating dielectric material, for example, silicon oxide (SiO), low-k dielectric materials, and combinations thereof.

In various embodiments, the gate structure(s) 140 can be referred to as lower gate structures 140, and the source/drain regions 160 can be referred to as lower source/drain regions 160. The gate region 145 can be referred to as a lower gate region 145, and the sidewall spacers 150 can be referred to as lower sidewall spacers 150. The interlayer dielectric (ILD) layer 170 can be referred to as a lower interlayer dielectric (ILD) layer 170.

Figure 9:
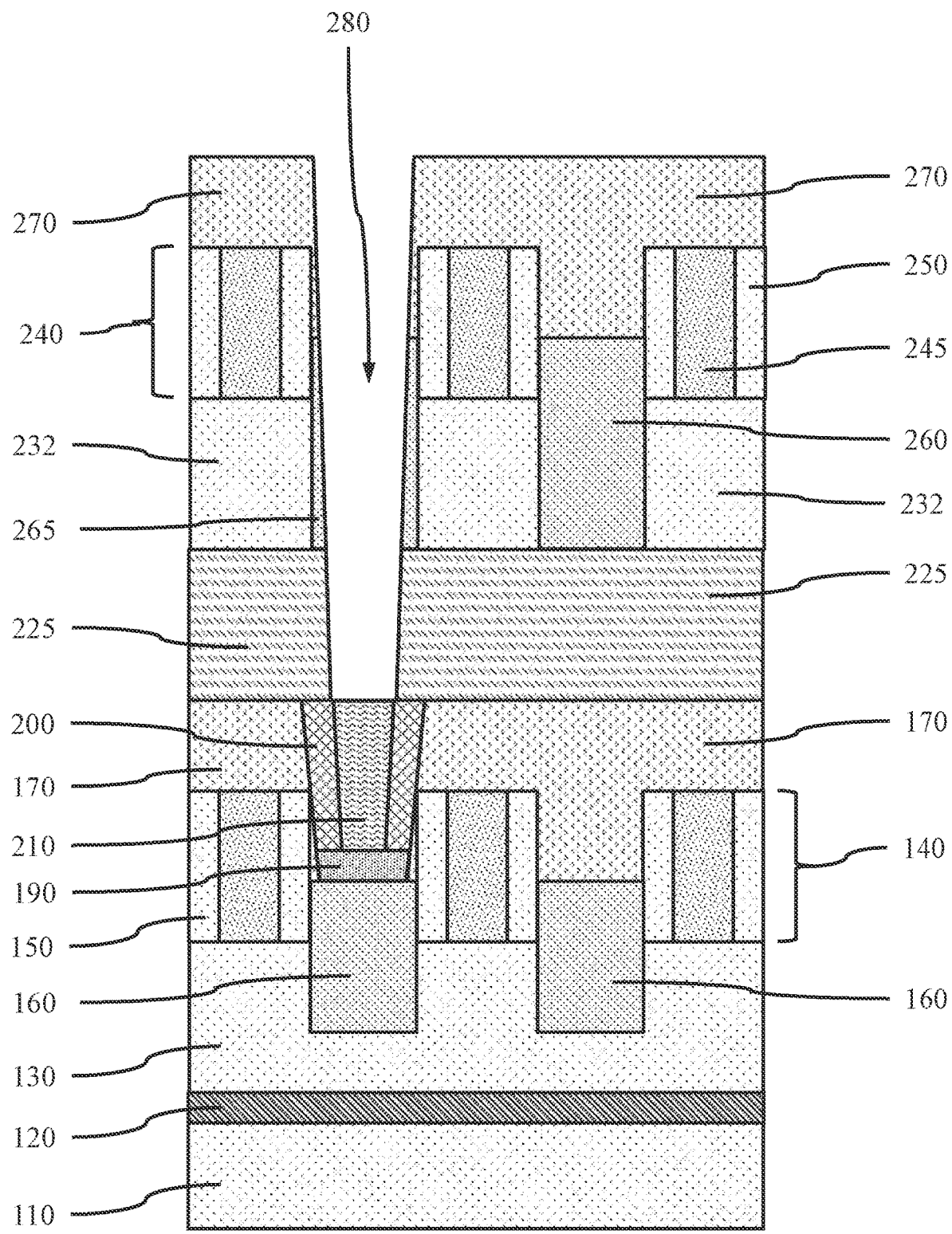
FIG. 9 is a cross-sectional side view showing a shared contact trench formed through an upper source/drain region and the dielectric bonding layer to the sacrificial plug, in accordance with an embodiment of the present invention.

FIG. 9 is a cross-sectional side view showing a shared contact trench formed through an upper source/drain region and the bonded dielectric layer to the sacrificial plug, in accordance with an embodiment of the present invention.

In one or more embodiments, a shared contact trench 280 can be formed through an upper interlayer dielectric (ILD) layer 270, upper source/drain region 260, and the bonded dielectric layer 225 to the sacrificial plug 210. The shared contact trench 280 can be formed by one or more selective directional etches (e.g., RIE), where a selective directional etch can be used to remove at least one of the intervening layers. In various embodiments, formation of the shared contact trench 280 through the upper source/drain region 260 can remove a portion of the upper source/drain region 260, while leaving upper source/drain section(s) 265 on opposite sides of the shared contact trench 280. The remaining upper source/drain section(s) 265 can form the source/drain for the upper active device. A portion of the upper interlayer dielectric (ILD) layer 270 can remain between the shared contact trench 280 and an upper sidewall spacer 250.

In various embodiments, removal of the bonded dielectric layer 225 to form the shared contact trench 280 can expose a top surface of the sacrificial plug 210.

Figure 10:
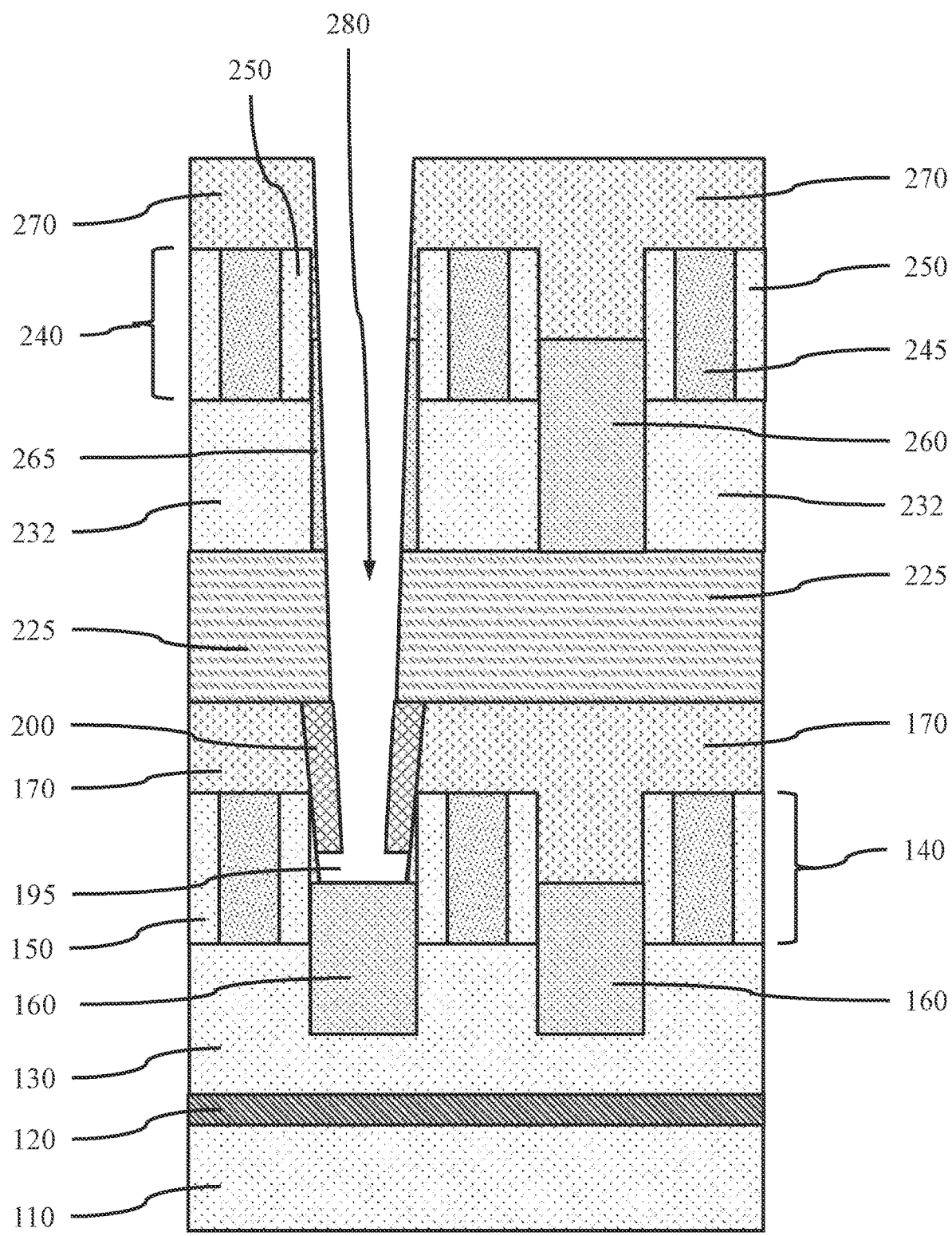
FIG. 10 is a cross-sectional side view showing removal of the sacrificial plug and the sacrificial contact to expose the conductive trench spacer and the lower source/drain region, in accordance with an embodiment of the present invention.

FIG. 10 is a cross-sectional side view showing removal of the sacrificial plug and the sacrificial contact to expose the conductive trench spacer and the lower source/drain region, in accordance with an embodiment of the present invention.

In one or more embodiments, the sacrificial plug 210 can be removed, for example, using a selective isotropic etch (e.g., wet chemical etch, dry plasma etch) that exposes the sidewalls of the conductive trench spacer 200. Removal of the sacrificial plug 210 can expose at least a portion of the sacrificial contact 190. The sacrificial contact 190 can be removed using a selective isotropic etch (e.g., wet chemical etch, dry plasma etch) to form a contact channel 195, and expose a top surface of the lower source/drain region 160. In various embodiments, the sacrificial plug 210 and sacrificial contact 190 can be removed together with the same etch. The contact channel 195 can be beneath the conductive trench spacer 200, where the shared contact trench 280 and the contact channel 195 can form a T-shaped contact on the lower source/drain region(s) 160. In various embodiments, a portion of the lower interlayer dielectric (ILD) layer 170 can remain between the contact channel 195 and the sidewall spacer 150.

Figure 11:
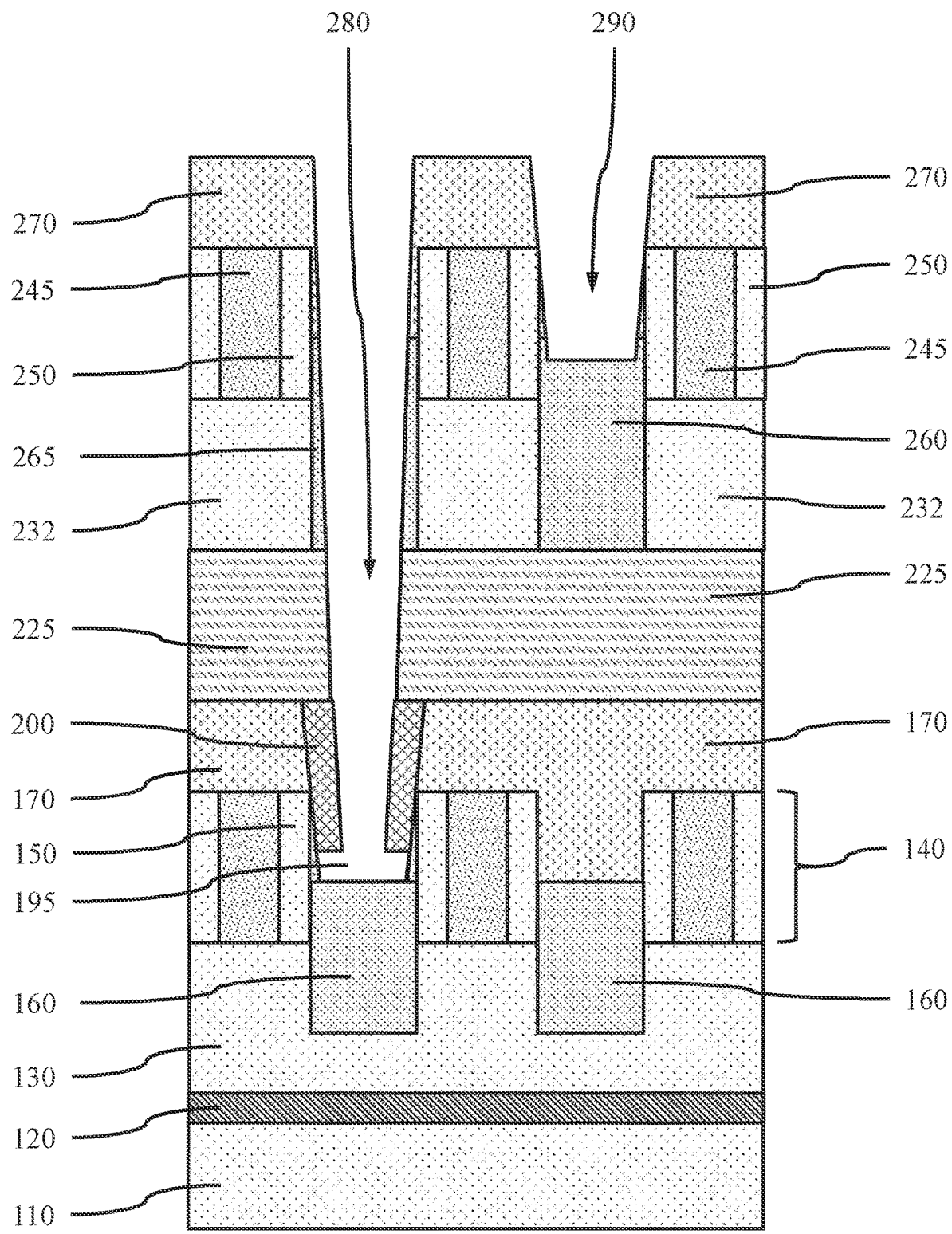
FIG. 11 is a cross-sectional side view showing an upper contact trench formed to another source/drain region, in accordance with an embodiment of the present invention.

FIG. 11 is a cross-sectional side view showing an upper contact trench formed to another source/drain region, in accordance with an embodiment of the present invention.

In various embodiments, an upper contact trench 290 can be formed in the upper ILD layer 270 to another upper source/drain region 260, where the upper contact trench 290 can be formed by lithographic patterning and etching, for example, using a selective directional etch (e.g., a reactive ion etch (RIE)). Formation of upper contact trench 290 can expose a top surface of the other upper source/drain region 260.

Figure 12:
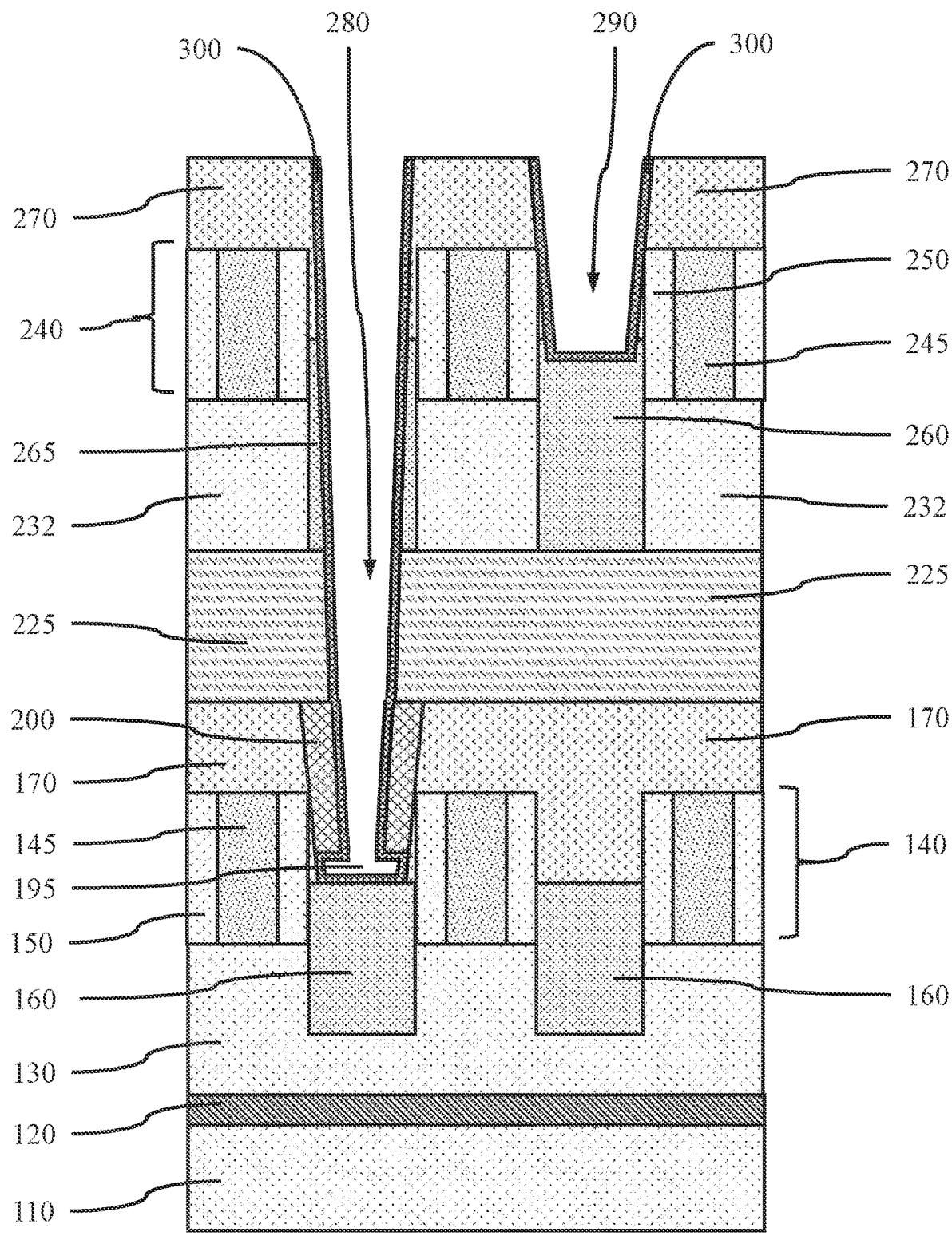
FIG. 12 is a cross-sectional side view showing a shared trench liner formed on the sidewalls of the upper contact trench and the conductive trench spacer, in accordance with an embodiment of the present invention.

FIG. 12 is a cross-sectional side view showing a shared trench liner formed on the sidewalls of the shared contact trench and the conductive trench spacer, as well as the upper contact trench, in accordance with an embodiment of the present invention.

In one or more embodiments, a shared trench liner 300 can be formed on the sidewalls of the shared contact trench 280 and the conductive trench spacer 200, as well as the upper contact trench 290, where the shared trench liner 300 can be formed by a conformal deposition (e.g., ALD, PEALD). The shared trench liner 300 can cover the surfaces of the upper ILD layer 270, upper source/drain section(s) 265, top active device layer 232, bonded dielectric layer 225, lower interlayer dielectric (ILD) layer 170, conductive trench spacer 200, and lower source/drain region 160 exposed by the shared contact trench 280.

In various embodiments, the shared trench liner 300 can be a silicide forming metal, including, but not limited to, titanium (Ti), nickel (Ni), nickel-platinum (NiPt), which can form a silicide with the material of the upper source/drain section(s) 265, upper source/drain region 260, and lower source/drain region 160. The shared trench liner 300 can be a multilayer structure that includes a thin adhesion layer formed on the silicide forming metal, where the adhesion layer can be, for example, titanium nitride (TiN). The shared trench liner 300 can form a conductive electrical connection to the upper source/drain section(s) 265 and upper source/drain region 260 for a conductive contact.

In various embodiments, the shared trench liner 300 can have a thickness in a range of about 1 nanometers (nm) to about 5 nm, or about 2 nm to about 4 nm, although other thicknesses are also contemplated.

Figure 13:
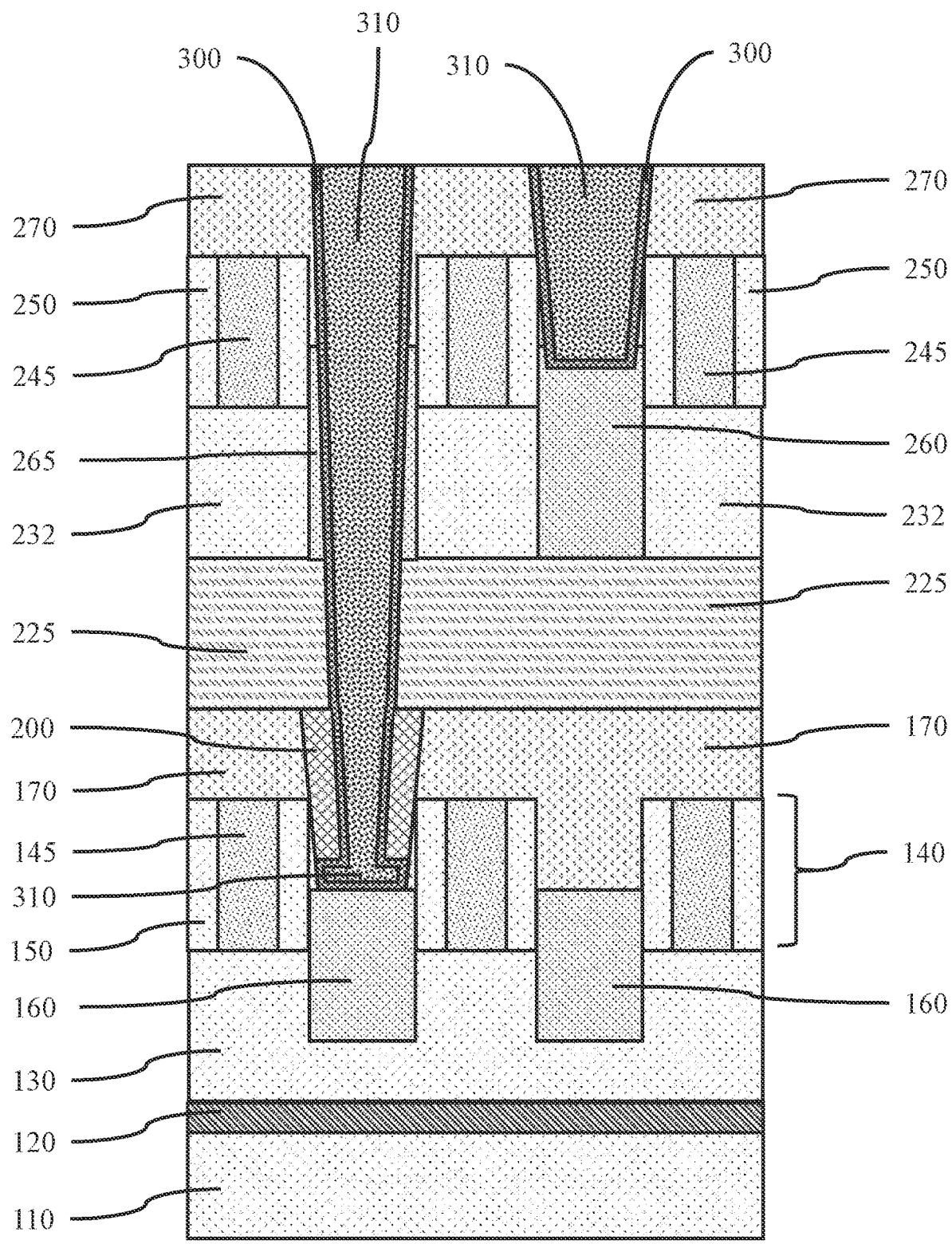
FIG. 13 is a cross-sectional side view showing a trench contact fill formed in the shared contact trench on the shared trench liner and in the upper contact trench, in accordance with an embodiment of the present invention.

FIG. 13 is a cross-sectional side view showing a trench contact fill formed in the shared contact trench on the shared trench liner and in the upper contact trench, in accordance with an embodiment of the present invention.

In one or more embodiments, a trench contact fill 310 can be formed in the shared contact trench 280 on the shared trench liner 300 and on the shared trench liner 300 in the upper contact trench 290 to form a shared contact. In various embodiments, the trench contact fill 310 can be formed in the shared contact trench 280 using a conformal deposition (e.g., ALD, PEALD) to avoid pinch-off and/or formation of void spaces within the trench contact fill 310 in the shared contact trench 280. The trench contact fill 310 can fill in the contact channel 195 adjoining the lower source/drain regions 160 using the conformal deposition, where the shared trench liner 300 and trench contact fill 310 in the shared contact trench 280 and the contact channel 195 can form a T-shaped shared contact to the lower source/drain region 160. The shared trench liner 300 and trench contact fill 310 can form a common electrical connection between source/drains of top and bottom devices of the stacked FET. The T-shaped shared contact with the conductive trench spacer 200 can have a larger critical dimension for the bottom source/drain contact without the need to excessively increase the top dimension of the shared contact trench 280.

In various embodiments, the trench contact fill 310 can be a conductive material, including, but not limited to, a metal, for example, cobalt (Co), tungsten (W), molybdenum (Mo), ruthenium (Ru), tungsten nitride (WN), and combinations thereof.

Figure 14:
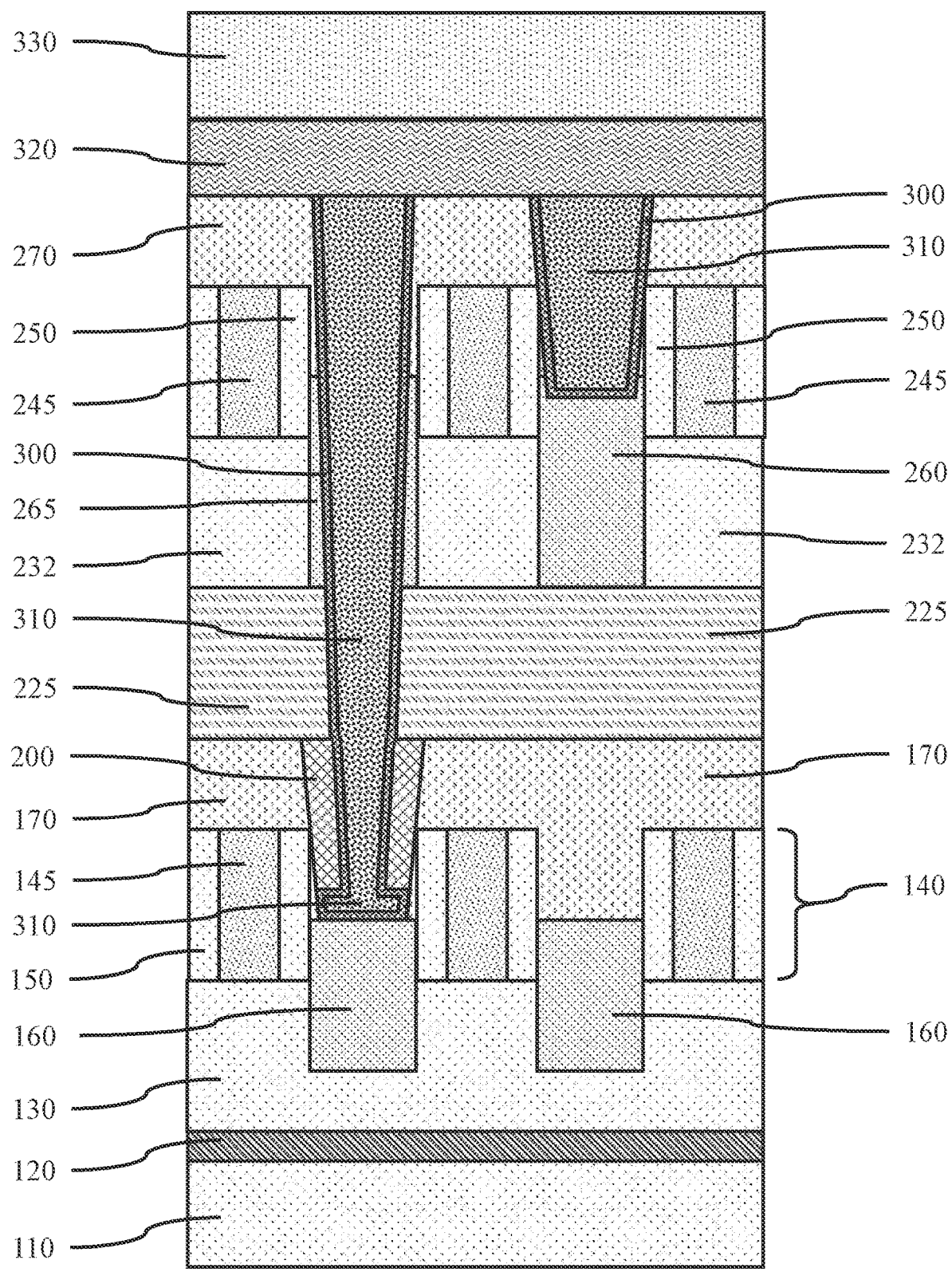
FIG. 14 is a cross-sectional side view showing back-end-of-line (BEOL) interconnect layer(s) formed on the trench contact fill in the shared contact trench and in the upper contact trench, and a carrier substrate on the BEOL layer, in accordance with an embodiment of the present invention.

FIG. 14 is a cross-sectional side view showing back-end-of-line (BEOL) interconnect layer(s) formed on the trench contact fill in the shared contact trench and in the upper contact trench, and a carrier substrate on the BEOL layer, in accordance with an embodiment of the present invention.

In one or more embodiments, a back-end-of-line (BEOL) interconnect layer 320 formed on the trench contact fill 310 in the shared contact trench 280 and in the upper contact trench 290, where the back-end-of-line (BEOL) interconnect layer 320 can include one (1) or more metallization layers and dielectric layers to form electrical contacts to the trench contact fill 310 in the shared contact trench 280 and in the upper contact trench 290.

In one or more embodiments, a carrier substrate 330 can be bonded to the BEOL interconnect layer 320, where the carrier substrate 330 can be bonded to the BEOL interconnect layer 320 by a dielectric bonding process, such as oxide-oxide bonding, or Cu—Cu bonding. The carrier substrate 330 can be a blanket Si wafer or a wafer containing other devices.

Figure 15:
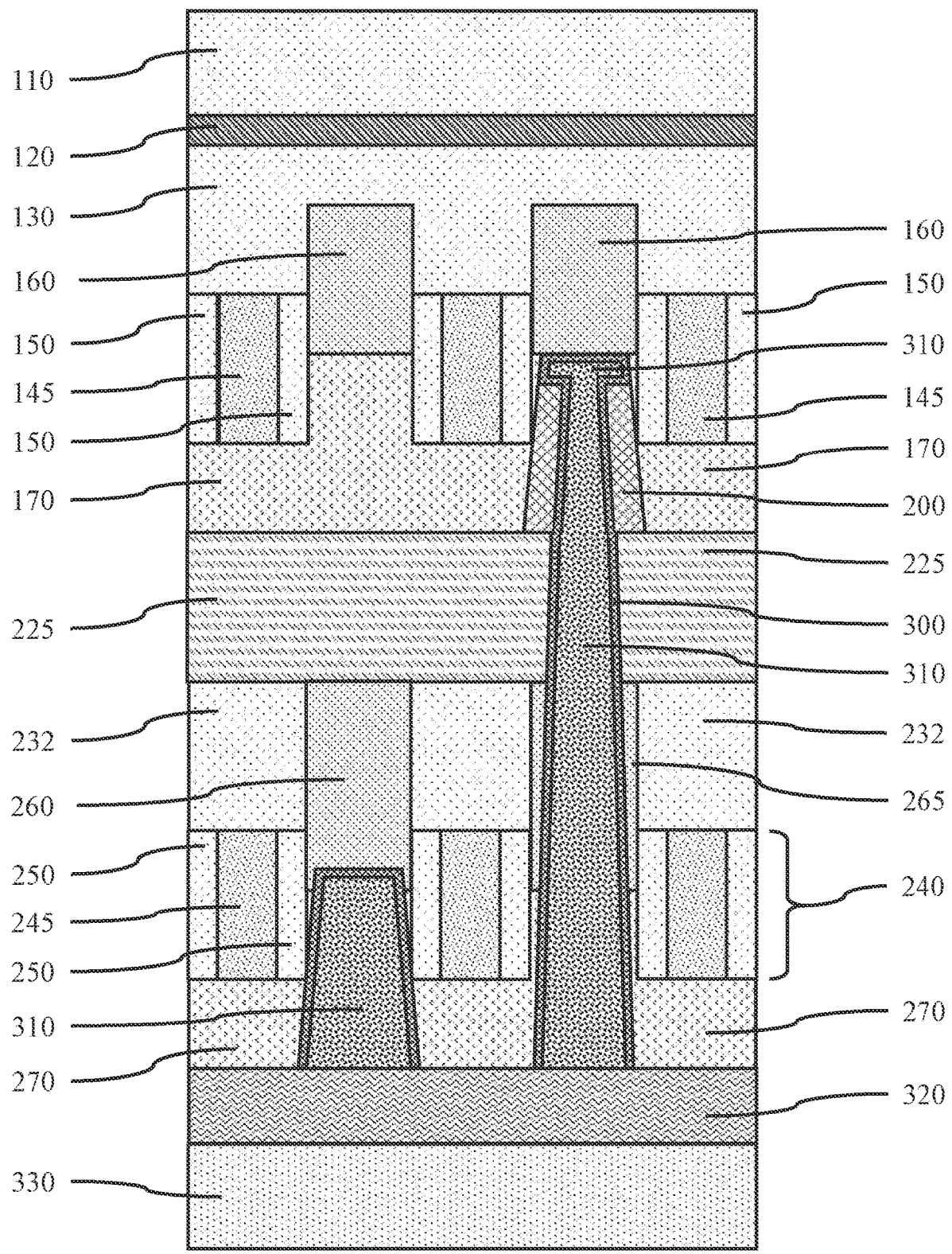
FIG. 15 is a cross-sectional side view showing a wafer flip to reverse the arrangement of the layers and facilitate the additional processing steps applied to the backside of the initial substrate, in accordance with an embodiment of the present invention.

FIG. 15 is a cross-sectional side view showing a wafer flip to reverse the arrangement of the layers and facilitate the additional processing steps applied to the backside of the initial substrate, in accordance with an embodiment of the present invention.

In one or more embodiments, a wafer flip can be conducted to reverse the order of the layers, such that a previously bottom surface of the support layer 110 now forms a top surface of the layers and devices. The lower source/drain region 160 can become proximal to the top surface.

Figure 16:
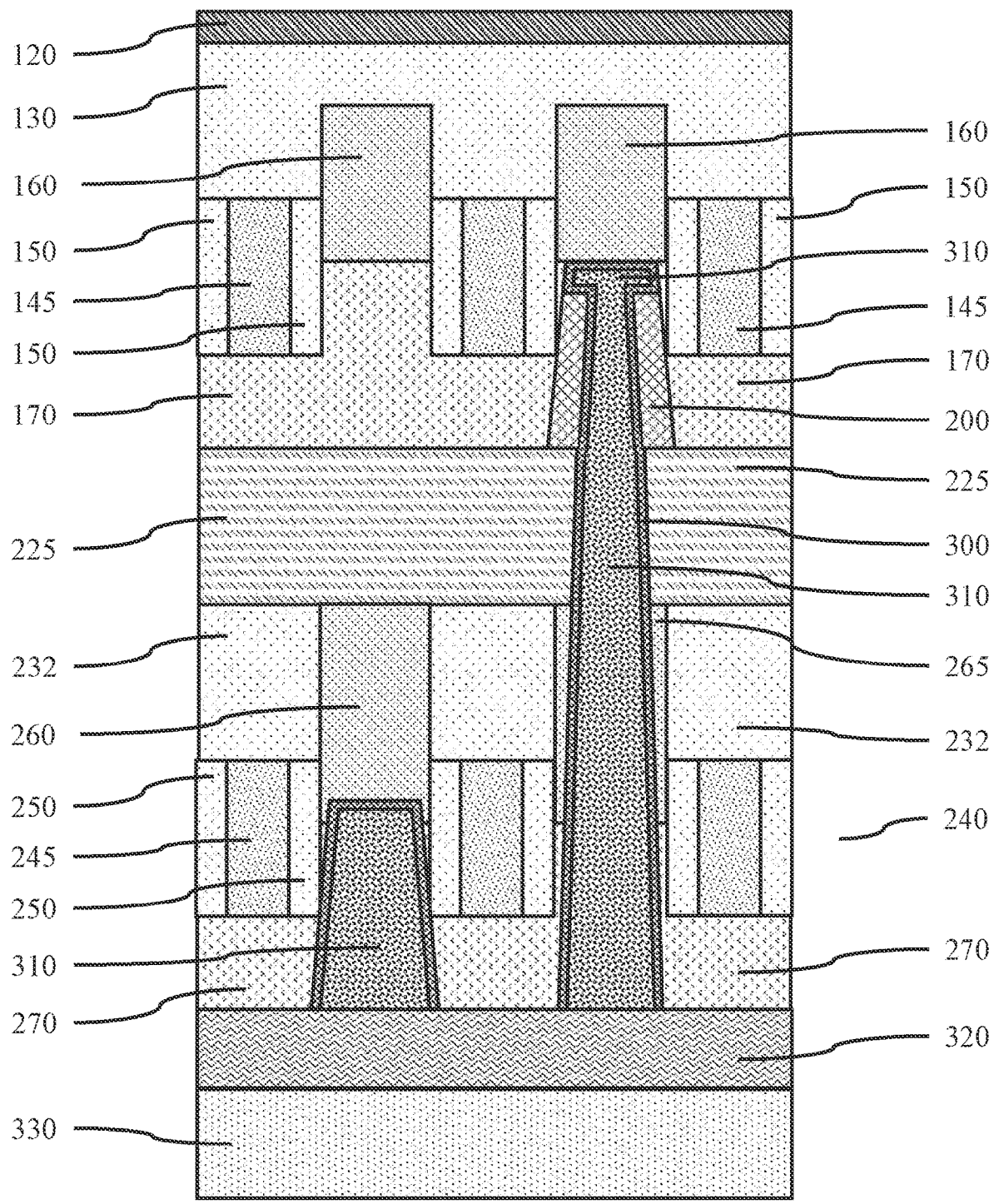
FIG. 16 is a cross-sectional side view showing removal of the initial substrate to expose an etch stop layer, in accordance with an embodiment of the present invention.

FIG. 16 is a cross-sectional side view showing removal of the initial substrate to expose an etch stop layer, in accordance with an embodiment of the present invention.

In one or more embodiments, the support layer 110 of the initial substrate can be removed to expose the etch stop layer 120 (e.g., insulating layer), where the support layer 110 can be removed by a wafer grinding process followed by selective etching (e.g., RIE, wet chemical etch, dry plasma etch, combinations thereof).

Figure 17:
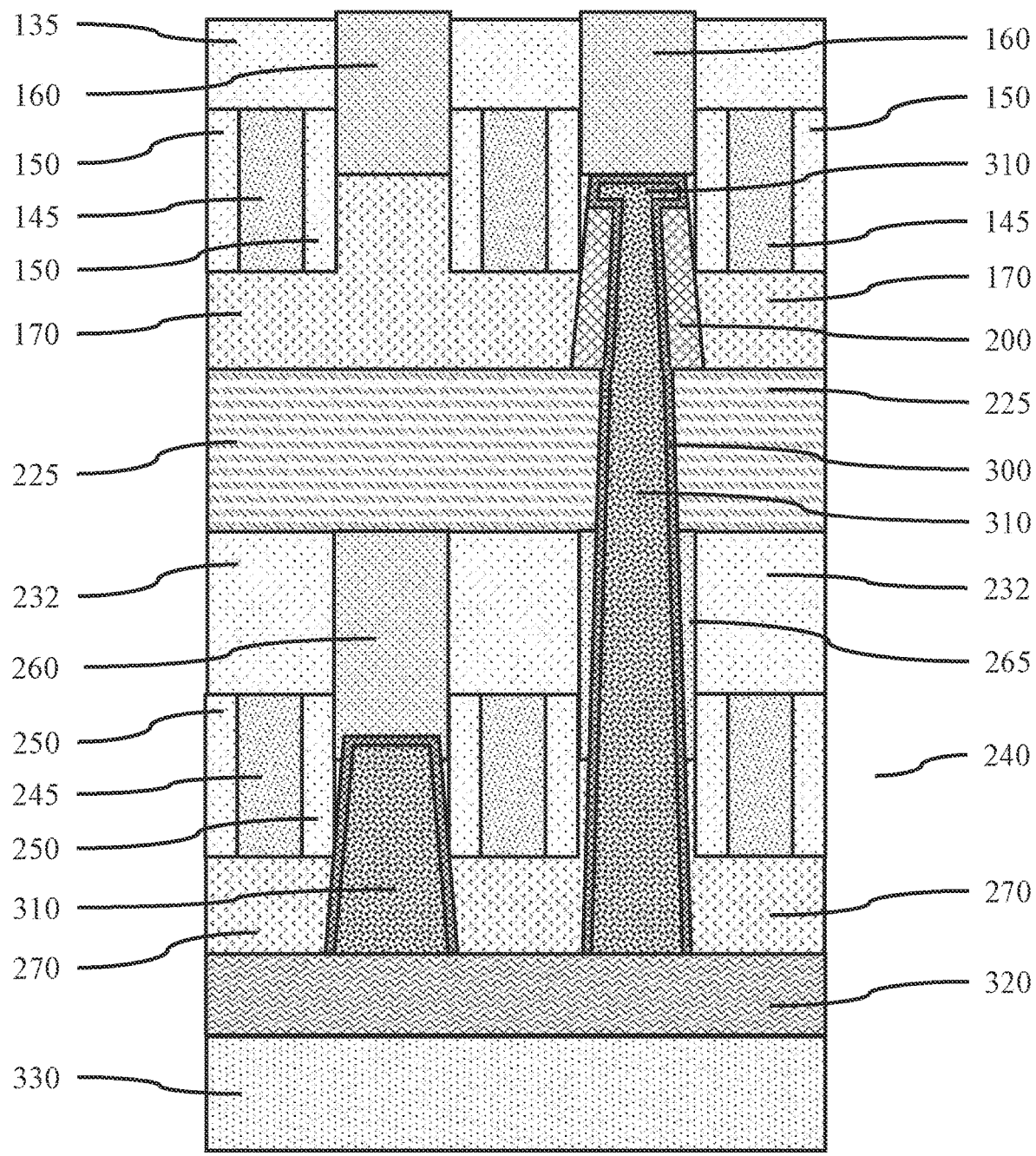
FIG. 17 is a cross-sectional side view showing removal of the etch stop layer to expose an active device layer, and removal of a portion of the active device layer to expose the source/drain regions, in accordance with an embodiment of the present invention.

FIG. 17 is a cross-sectional side view showing removal of the etch stop layer to expose an active device layer, and removal of a portion of the active device layer to expose the source/drain regions, in accordance with an embodiment of the present invention.

In one or more embodiments, the etch stop layer 120 can be removed to expose the lower active device layer 130, where the etch stop layer 120 can be removed by a selective etch.

In various embodiments, a portion of the lower active device layer 130 can be removed to expose a portion of the lower source/drain regions 160, where the portion of the lower active device layer 130 can be removed using a selective etch (e.g., RIE, wet chemical etch, dry plasma etch, combinations thereof) or timed etch is the lower S/D region 160 are made of similar materials as active device layer 130 (e.g. Si). Removal of the portion of the lower active device layer 130 can form a reduced height active device layer 135.

Figure 18:
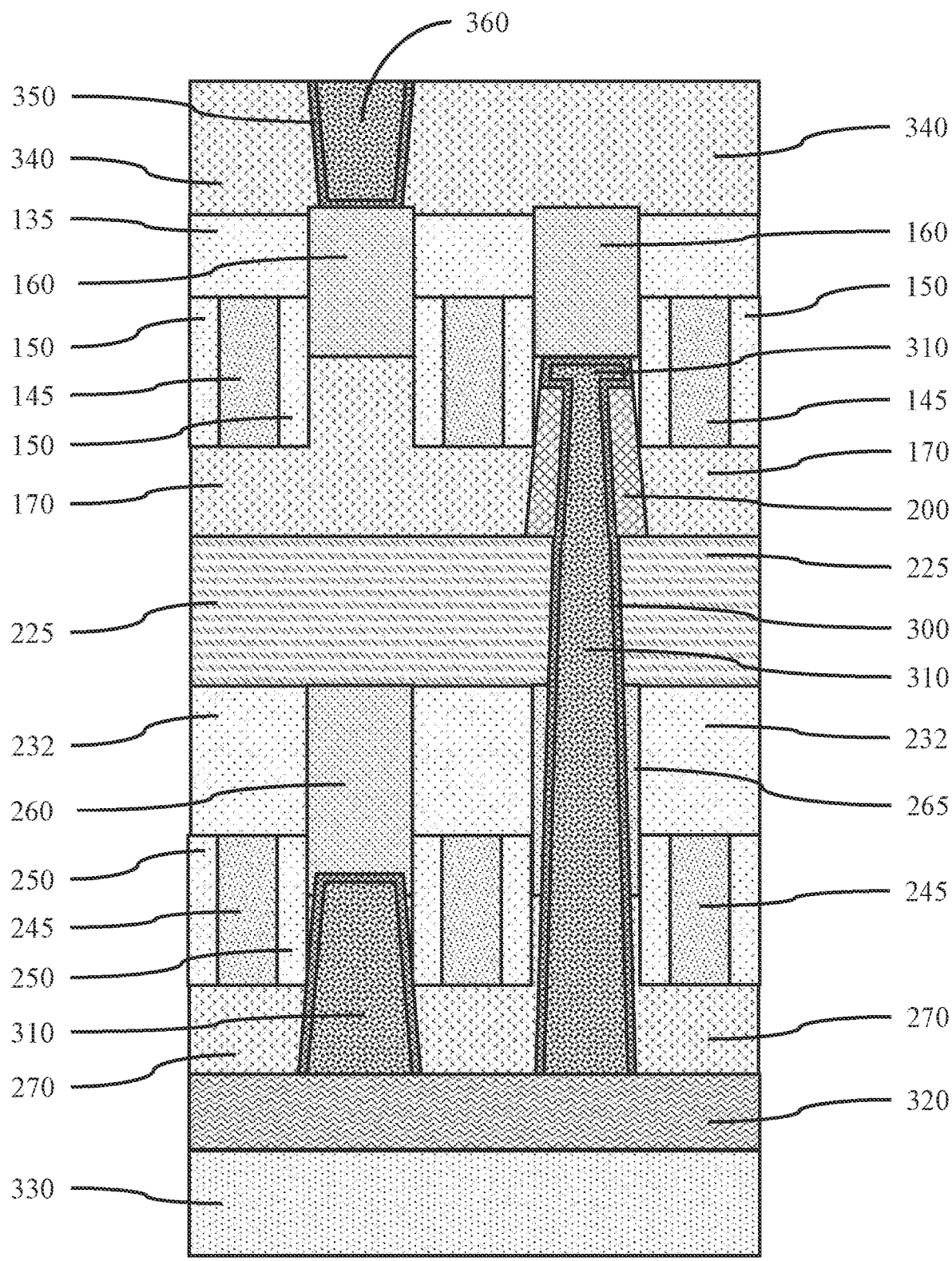
FIG. 18 is a cross-sectional side view showing formation of a back-side ILD layer on the expose source/drain regions, and a back-side contact formed to a source/drain region, in accordance with an embodiment of the present invention.

FIG. 18 is a cross-sectional side view showing formation of a back-side ILD layer on the expose source/drain regions, and a back-side contact formed to a source/drain region, in accordance with an embodiment of the present invention.

In various embodiments, a back-side ILD layer 340 can be formed on the expose lower source/drain regions 160 and reduced height active device layer 135, where the back-side ILD layer 340 can be formed by a blanket deposition (e.g., CVD, PECVD).

In various embodiments, a back-side contact 360 can be formed in the back-side ILD layer 340 to the lower source/drain region 160, where the back-side contact 360 can be formed by etching a back-side trench, forming a back-side trench liner 350 and forming a back-side contact fill in the back-side trench.

Figure 19:
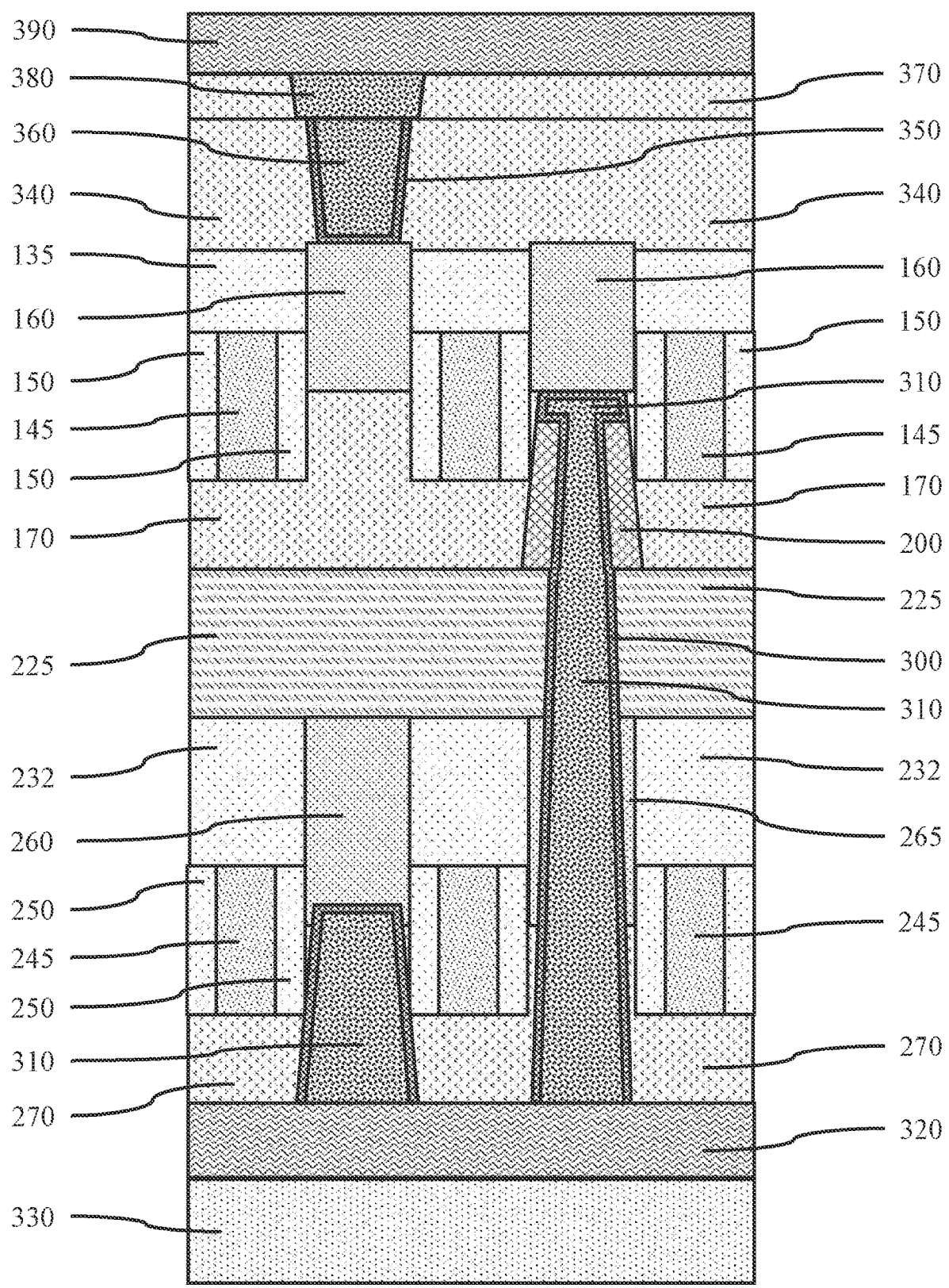
FIG. 19 is a cross-sectional side view showing formation of a back-side power rail on the back-side contact, and a back-side distribution network formed to the back-side power rail, in accordance with an embodiment of the present invention.

FIG. 19 is a cross-sectional side view showing formation of a back-side power rail on the back-side contact, and a back-side distribution network formed to the back-side power rail, in accordance with an embodiment of the present invention.

In one or more embodiments, an insulating cover layer 370 can be formed on the back-side ILD layer 340 and back-side contact 360, where the insulating cover layer 370 can be formed by a blanket deposition (e.g., CVD, PECVD).

In one or more embodiments, a back-side power rail 380 can be formed in the insulating cover layer 370 on the back-side contact 360, where the back-side power rail 380 can be in electrical contact with the back-side contact 360.

In one or more embodiments, a back-side distribution network 390 formed to the back-side power rail 380, where the back-side distribution network 390 can comprises one or more layers of metal lines and via connections in between, which can supply the power to the device above.

In various embodiments, the additional wiring for the back-side power rail 380 over the backside contact 360 can also be signal wires, and the back-side distribution network 390 can be higher levels of backside interconnects.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stacked device, comprising:
   a reduced height active device layer;
   a plurality of lower source/drain regions in the reduced height active device layer;
   a lower interlayer dielectric (ILD) layer on the plurality of lower source/drain regions;
   a conductive trench spacer in the lower interlayer dielectric (ILD) layer, wherein the conductive trench spacer is adjacent to one of the plurality of lower source/drain regions;
   a top active device layer adjacent to the lower interlayer dielectric (ILD) layer;
   an upper source/drain section in the top active device layer; and
   a shared contact in electrical connection with the upper source/drain section, the conductive trench spacer, and the one of the plurality of lower source/drain regions, the shared electrical contact having a T-shaped geometry contact providing a backside contact to the upper source/drain section, wherein the shared contact further comprises a shared trench liner continuously providing electrical conductivity between the plurality of lower source/drain regions and the upper source drain region in electrical contact through the shared contact.

2. The device of claim 1, further comprising a lower gate structure adjoining the one of the plurality of lower source/drain regions, and an upper gate structure adjoining the upper source/drain section.

3. The device of claim 2, further comprising a bonded dielectric layer between the top active device layer and the lower interlayer dielectric (ILD) layer, wherein the shared contact extends through the bonded dielectric layer.

4. The device of claim 3, wherein the shared contact includes a shared trench liner and a trench contact fill on the shared trench liner.

5. The device of claim 3, further comprising a back-side contact in electrical connection with a second of the plurality of lower source/drain regions, wherein the back-side contact is on a side opposite the plurality of lower source/drain regions from the shared contact.

6. The device of claim 5, further comprising a back-side power rail on and in electrical connection with the back-side contact.

7. The device of claim 6, further comprising back-side distribution network on and in electrical connection with the back-side power rail.

8. The device of claim 7, further comprising a back-end-of-line (BEOL) interconnect layer on and in electrical connection with the shared contact.

9. The device of claim 8, wherein the shared contact is T-shaped.

10. A stacked device, comprising:
a reduced height active device layer;
a plurality of lower source/drain regions in the reduced height active device layer;
a gate structure adjoining an adjacent pair of the plurality of lower source/drain regions;
a lower interlayer dielectric (ILD) layer on the plurality of lower source/drain regions;
a conductive trench spacer in the lower interlayer dielectric (ILD) layer, wherein the conductive trench spacer is adjacent to one of the adjacent pair of the plurality of lower source/drain regions;
a bonded dielectric layer adjacent to the lower interlayer dielectric (ILD) layer;
a top active device layer adjacent to the bonded dielectric layer, wherein the bonded dielectric layer is between the lower interlayer dielectric (ILD) layer and the top active device layer;
an upper source/drain section in the top active device layer; and
a shared contact in electrical connection with the upper source/drain section, the conductive trench spacer, and the one of the plurality of lower source/drain regions, the shared electrical contact having a T-shaped geometry contact providing a backside contact to the upper source/drain section, wherein the shared contact further comprises a shared trench liner continuously providing electrical conductivity between the plurality of lower source/drain regions and the upper source drain region in electrical contact through the shared contact.

11. The device of claim 10, wherein the shared contact includes a shared trench liner and a trench contact fill on the shared trench liner.

12. The device of claim 11, wherein the shared contact is T-shaped.

13. The device of claim 12, further comprising a back-side contact in electrical connection with a second of the adjacent pair of the plurality of lower source/drain regions, wherein the back-side contact is on a side of the plurality of lower source/drain regions opposite from the shared contact.

14. The device of claim 13, wherein the trench contact fill is selected from cobalt (Co), tungsten (W), molybdenum (Mo), ruthenium (Ru), tungsten nitride (WN), and combinations thereof, and the conductive trench spacer is made of a conductive metal compound material selected from the group consisting of tantalum nitride (TaN), tantalum carbide (TaC), titanium nitride (TiN), titanium carbide (TiC), tungsten nitride (WN), and combinations thereof.

\* \* \* \* \*